(12) United States Patent
Aoki (10) Patent No.: US 7,177,136 B2
(45) Date of Patent: Feb. 13, 2007

(54) WIRING BOARD, ELECTRO-OPTICAL DEVICE, METHOD OF MANUFACTURING THE ELECTRO-OPTICAL DEVICE, AND ELECTRONIC INSTRUMENT

(75) Inventor: Koji Aoki, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 206 days.

(21) Appl. No.: 10/764,522

(22) Filed: Jan. 27, 2004

(65) Prior Publication Data

US 2004/0253425 A1 Dec. 16, 2004

(30) Foreign Application Priority Data

Feb. 6, 2003 (JP) ............................. 2003-029656
Nov. 10, 2003 (JP) ............................. 2003-379939

(51) Int. Cl.
*H01G 4/228* (2006.01)

(52) U.S. Cl. .............................. 361/306.1; 361/306.3; 361/321.1; 361/694; 361/696; 174/252; 174/254; 174/260; 174/262

(58) Field of Classification Search ............. 361/306.1, 361/306.3, 689, 694, 696, 321.1; 174/252, 174/260, 262, 254; 349/149, 150
See application file for complete search history.

(56) References Cited

U.S. PATENT DOCUMENTS

| 5,631,446 | A  | * | 5/1997  | Quan ......................... 174/254 |
| 6,084,778 | A  | * | 7/2000  | Malhi ........................ 361/749 |
| 6,228,465 | B1 | * | 5/2001  | Takiguchi et al. .......... 428/209 |
| 6,692,845 | B2 |   | 2/2004  | Maruyama et al. |
| 6,720,198 | B2 | * | 4/2004  | Yamagata et al. ............ 438/29 |
| 6,740,981 | B2 | * | 5/2004  | Hosomi ....................... 257/778 |
| 6,744,198 | B2 |   | 6/2004  | Hirabayashi |
| 6,787,807 | B2 | * | 9/2004  | Yamazaki et al. ............ 257/65 |
| 6,829,023 | B2 |   | 12/2004 | Goto |
| 6,887,631 | B2 | * | 5/2005  | Kiguchi et al. ................ 430/7 |
| 6,933,671 | B2 |   | 8/2005  | Nakanishi |
| 2003/0015961 | A1 |   | 1/2003  | Yamazaki |
| 2004/0201048 | A1 |   | 10/2004 | Seki et al. |

(Continued)

FOREIGN PATENT DOCUMENTS

JP        A 11-024606        1/1999

(Continued)

OTHER PUBLICATIONS

U.S. Appl. No. 10/760,584, filed Jan. 2004, Aoki.

*Primary Examiner*—Nguyen T. Ha.
(74) *Attorney, Agent, or Firm*—Oliff & Berridge PLC (57) ABSTRACT

A wiring board has a substrate, a bank disposed above the substrate and providing a plurality of regions, and a conductive layer and first and second interconnecting lines which are parallel to each other and formed between the bank and the substrate. The first interconnecting line is formed in a position closer to the substrate than the second interconnecting line. The vertical centerline of the first interconnecting line is not coincide with the vertical centerline of the second interconnecting lines. The conductive layer is formed in a position closer to the substrate than the second interconnecting line. The vertical centerline of the conductive layer is not coincide with the vertical centerline of the second interconnecting line. The conductive layer and first interconnecting line have portions which are not located under the second interconnecting line and extend in opposite width directions.

18 Claims, 9 Drawing Sheets

U.S. PATENT DOCUMENTS

2005/0057151 A1 3/2005 Kuwabara

FOREIGN PATENT DOCUMENTS

| | | |
|---|---|---|
| JP | 2002-026473 | 1/2002 |
| JP | 2002-33195 | 1/2002 |
| JP | 2002-208491 | 7/2002 |
| JP | 2002-334782 | 11/2002 |
| JP | 2002-352955 | 12/2002 |
| JP | 2004-127933 | 4/2004 |
| KR | P2001-0107409 | 12/2001 |
| KR | 2003-0051343 | 6/2003 |

* cited by examiner

WIRING BOARD, ELECTRO-OPTICAL DEVICE, METHOD OF MANUFACTURING THE ELECTRO-OPTICAL DEVICE, AND ELECTRONIC INSTRUMENT

Japanese Patent Application No. 2003-29656, filed on Feb. 6, 2003, and Japanese Patent Application No. 2003-379939, filed on Nov. 10, 2003, are hereby incorporated by reference in their entirety.

BACKGROUND OF THE INVENTION

The present invention relates to a wiring board, electro-optical device, a method of manufacturing the electro-optical device and an electronic instrument.

In an electroluminescent panel, banks are formed to separate adjacent segments of a light-emitting layer. Under the banks, interconnecting lines may be formed. If in order to lay out two interconnecting lines separated as far as possible, they are at different heights and somewhat offset, a bank to be formed over them is not laterally symmetrical. As a result, since the bank slope is laterally asymmetrical, the film thickness of the light-emitting layers is not uniform. This is not limited to a electroluminescent panel, but applies to any device in which banks are formed to separate segments of a functional layer from each other, and a plurality of interconnecting lines pass under the bank.

BRIEF SUMMARY OF THE INVENTION

According to a first aspect of the present invention, there is provided a wiring board comprising:

a substrate;

a bank which is disposed above the substrate to provide a plurality of regions; and a conductive layer and first and second interconnecting lines formed between the substrate and the bank, wherein:

the bank has a top surface and a pair of side surfaces provided on both sides of the top surface; and the side surfaces slopes symmetrically with respect to the substrate.

According to a second aspect of the present invention, there is provided an electro-optical device comprising:

the above wiring board; and a functional layer disposed in each of the regions provided by the bank.

According to a third aspect of the present invention, there is provided an electronic instrument comprising the above electro-optical device.

According to a fourth aspect of the present invention, there is provided a method of manufacturing an electro-optical device comprising:

forming the above wiring board; and forming a functional layer by disposing a liquid material including a functional layer material in each of the regions provided by the bank.

DETAILED DESCRIPTION OF THE EMBODIMENT

The object of the embodiments of the present invention is to reduce the lateral asymmetry of the bank.

(1) According to one embodiment of the present invention, there is provided a wiring board comprising:

a substrate;

a bank which is disposed above the substrate to provide a plurality of regions; and a conductive layer and first and second interconnecting lines formed between the substrate and the bank, wherein:

the bank has a top surface and a pair of side surfaces provided on both sides of the top surface; and the side surfaces slopes symmetrically with respect to the substrate.

Since the bank is laterally symmetrical in this embodiment, a film can be formed uniformly in the regions into which the substrate is divided by the bank.

(2) In this wiring board, the first interconnecting line may be formed in a position closer to the substrate than the second interconnecting line, and the vertical centerline of the first interconnecting line may not be coincide with the vertical centerline of the second interconnecting line; the conductive layer may be formed in a position closer to the substrate than the second interconnecting line, and the vertical centerline of the conductive layer may not be coincide with the vertical centerline of the second interconnecting line; and the conductive layer and the first interconnecting line may respectively have portions which are not located under the second interconnecting line, and the portions may extend in opposite width directions. This makes it possible to reduce the lateral asymmetry of the bank above the conductive layer and the first interconnecting layer, since the conductive layer and the first interconnecting line have portions which are not overlapped by the second interconnecting line and extend in opposite directions.

(3) In this wiring board, the lengths of the portions of the conductive layer and the first interconnecting line not located under the second interconnecting line may be equal.

(4) In this wiring board, the second interconnecting line may be disposed right under the bank and within a range corresponding to the distance between the side surfaces of the bank.

(5) In this wiring board, the bank may include a first bank portion formed of an inorganic material, and a second bank portion formed of an organic material on the first bank portion; and the second interconnecting line may be disposed right under the first and second bank portions and within a range corresponding to the distance between the side surfaces of the bank.

(6) In this wiring board, a depression may be formed in the substrate; and the conductive layer and the first interconnecting line may be disposed within the depression so as not to project above the surface of the substrate.

(7) In this wiring board, the conductive layer may be one of electrodes of a capacitor.

(8) In this wiring board, the first and second interconnecting lines may be respectively a signal line and a power supply line.

(9) In this wiring board, the first interconnecting line may constitute a part of a first drive circuit; and the conductive layer and the second interconnecting line may constitute a part of a second drive circuit.

(10) According to one embodiment of the present invention, there is provided an electro-optical device comprising:

the above wiring board; and a functional layer disposed in each of the regions provided by the bank.

(11) According to one embodiment of the present invention, there is provided an electronic instrument comprising the above electro-optical device.

(12) According to one embodiment of the present invention, there is provided a method of manufacturing an electro-optical device comprising:

forming the above wiring board; and forming a functional layer by disposing a liquid material including a functional layer material in each of the regions provided by the bank.

Since the bank is laterally symmetrical in this embodiment, a uniform functional layer can be formed even when using a liquid material.

The embodiments of the present invention will be described below with reference to the drawings.

Figure 1:
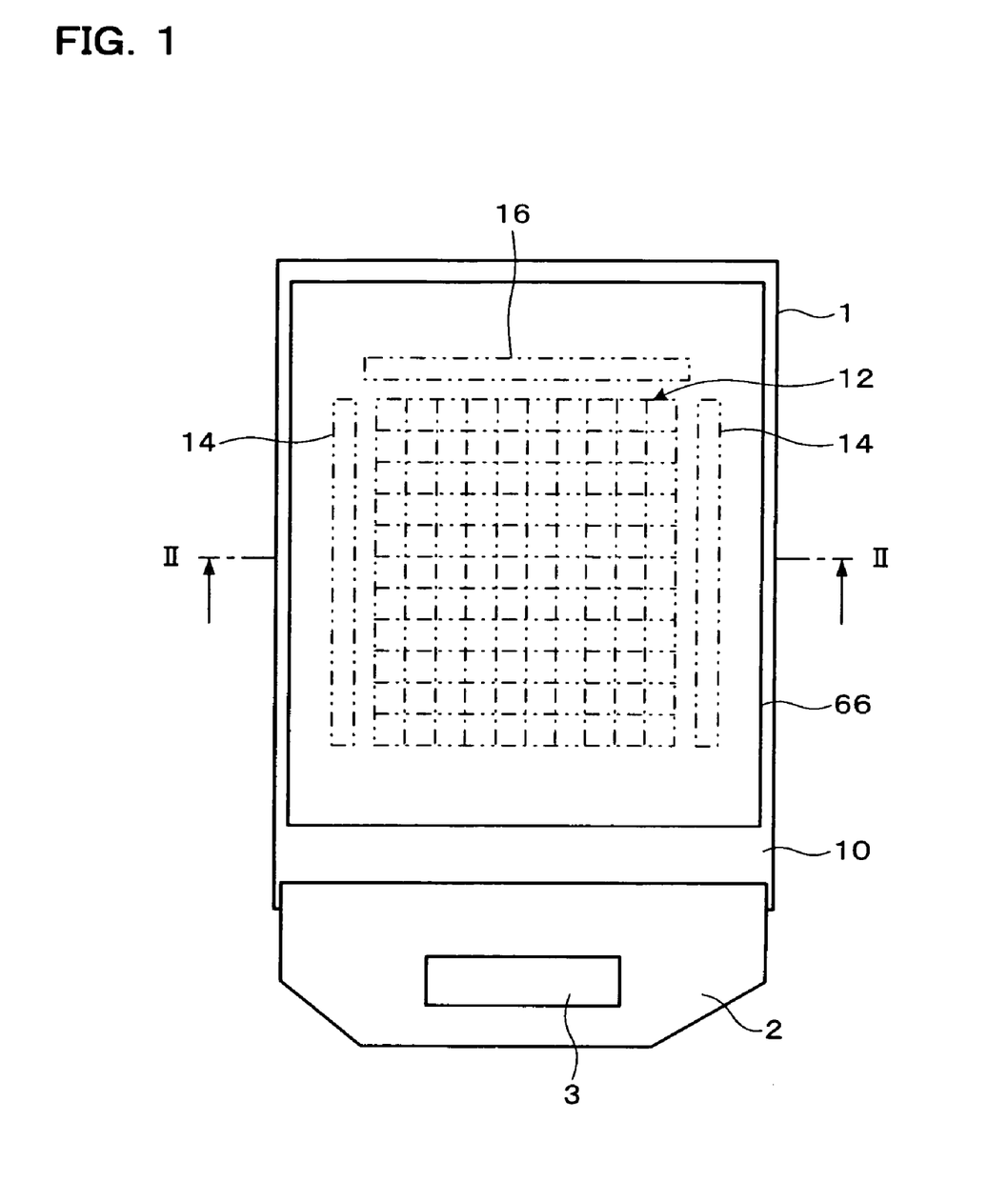
FIG. 1 illustrates an electro-optical device according to one embodiment of the present invention.
Figure 2:
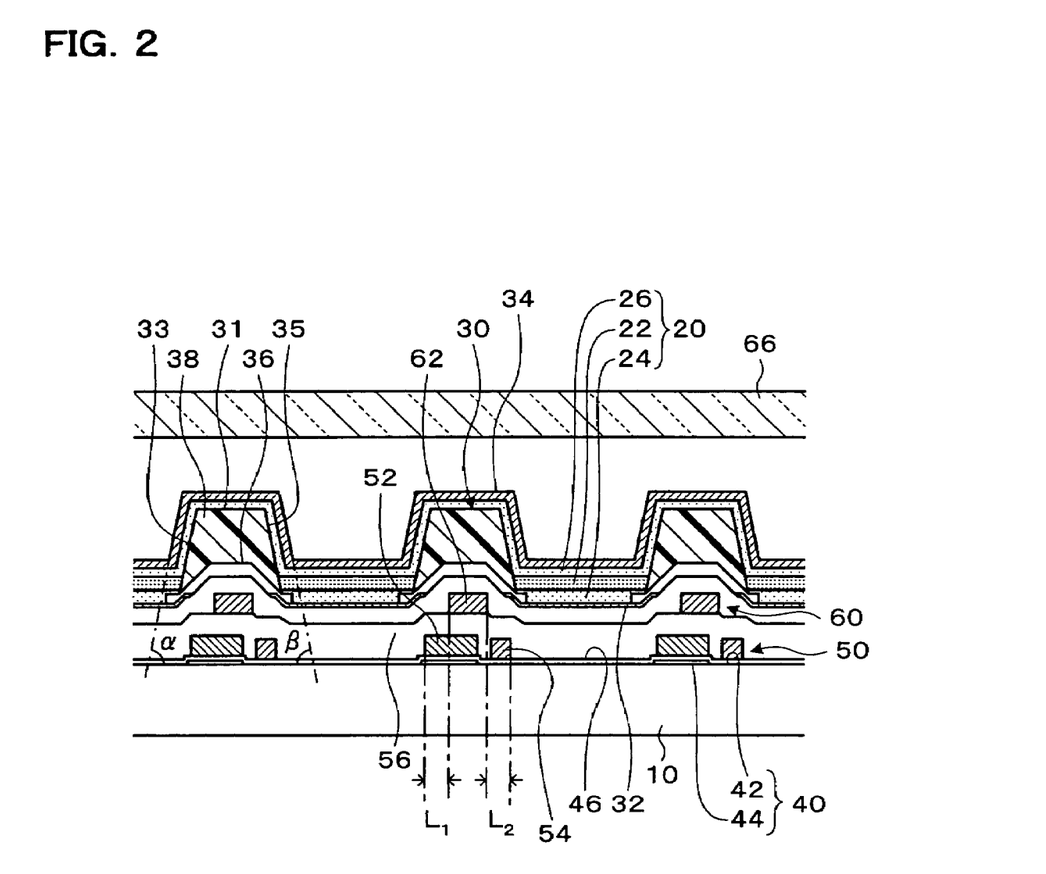
FIG. 2 is a cross-sectional view taken along the line II—II in FIG. 1.

FIG. 1 illustrates an electro-optical device according to one embodiment of the present invention. FIG. 2 is a cross-sectional view taken along the line II—II in FIG. 1. An electro-optical device 1 may be an electro-optical device such as a display device (for example a display panel), or a memory device. The electro-optical device 1 shown in FIG. 1 is an organic electroluminescence (EL) device (for example an organic EL panel). To the electro-optical device 1, a wiring board (for example a flexible substrate) 2 is attached, and is electrically connected. For this attachment and electrical connection, an anisotropic conductive material such as an anisotropic conductive film or anisotropic conductive paste or the like may be used. By electrical connection is included the case of contact. This also applies in the same way to the following description. The wiring board 2 has formed an interconnecting pattern and terminals not shown in the drawings. On the wiring board 2, an integrated circuit chip (or semiconductor chip) 3 is mounted. The integrated circuit chip 3 may have a power supply circuit, control circuit, or the like. For the mounting, tape automated bonding (TAB) or chip-on-film (COF) may be applied, and the package format may be a tape carrier package(TCP). The electro-optical device 1 having the wiring board 2 on which the integrated circuit chip 3 is mounted can be referred to as an electronic module (for example, a display module such as a liquid crystal module, an EL module, or the like).

The electro-optical device 1 has a substrate 10. The substrate 10 may be a rigid substrate (for example a glass substrate or silicon substrate), or may be a flexible substrate (for example a film substrate). The substrate 10 may be transparent to light, or may be opaque. For example, in a bottom emission (or back emission) type of display device (for example an organic EL panel), a transparent substrate 10 may be used, and light emitted from the side of the substrate 10. In a top emission type of organic EL panel, an opaque substrate 10 may be used. It should be noted that the substrate 10 is not limited to being of plate form, and includes the case of other forms, provided that the other elements can be supported.

The substrate 10 includes an operating region (for example a display region) 12. The operating region 12 may have formed a plurality of (for example, m rows and n columns (for example a matrix) of) pixels. In a color display device, one color display pixel may include a plurality of sub-pixels (red, green, and blue).

On the substrate 10, one or a plurality of drive circuits (for example a scan line drive circuit) 14 may be provided. The drive circuit 14 drives the operation (for example display operation) of the operating region 12. A pair of drive circuits 14 may be disposed adjacent to both sides of the operating region 12. On the substrate 10, an auxiliary circuit 16 may be provided. The auxiliary circuit 16 may be a checking circuit for checking whether the operation (for example display operation) of the operating region 12 is correct, or may be a precharge circuit for increasing the operating speed (display speed) of the operating region 12. At least one of the drive circuit 14 and auxiliary circuit 16 may be formed using a polysilicon film or the like on the substrate 10, or may be an integrated circuit chip mounted on the substrate 10. It should be noted that the integrated circuit chip 3 on the outside of the substrate 10 may be adapted to control the operating drive of the operating region 12.

On the substrate 10, a plurality of operating elements 20 is provided. The region in which the plurality of operating elements 20 is provided is the operating region 12. One operating element 20 is provided for each pixel (for example sub-pixel). As shown in FIG. 2, the plurality of operating elements 20 has a plurality of functional layers 22. The plurality of functional layers 22 may be a plurality of light-emitting layers for a plurality of light-emission colors (for example red, green, and blue). In this case, each functional layer 22 is a light-emitting layer for one of the light-emission colors. The material constituting a light-emitting layer as the functional layer 22 may be a polymer material or a material of low molecular weight or a material using combination of the two. The light-emitting layer as the functional layer 22 emits light when an electric current flows. The light-emitting layer as the functional layer 22 may have different light emitting efficiencies for different emitted light colors. It should be noted that the functional layer 22 may be formed by distributing a liquid material including the functional layer material (for example by a droplet ejection method such as an inkjet). Since the bank 30 has lateral symmetry, even if a liquid material is used, a plurality of functional layers 22 of uniform thickness can be formed.

The operating element 20 may have either or both first and second buffer layers 24 and 26. The first buffer layer 24 may be a positive hole injection layer for stabilizing the injection of positive holes into the functional layer 22, or may have a positive hole injection layer. The first buffer layer 24 may have a positive hole transport layer. The positive hole transport layer may be provided between the functional layer 22 and the positive hole injection layer. The second buffer layer 26 may be an electron injection layer stabilizing the injection of electrons into the functional layer 22, or may have an electron injection layer. The second buffer layer 26 may have an electron transport layer. The electron transport layer may be provided between the functional layer 22 and the electron injection layer.

Figure 3:
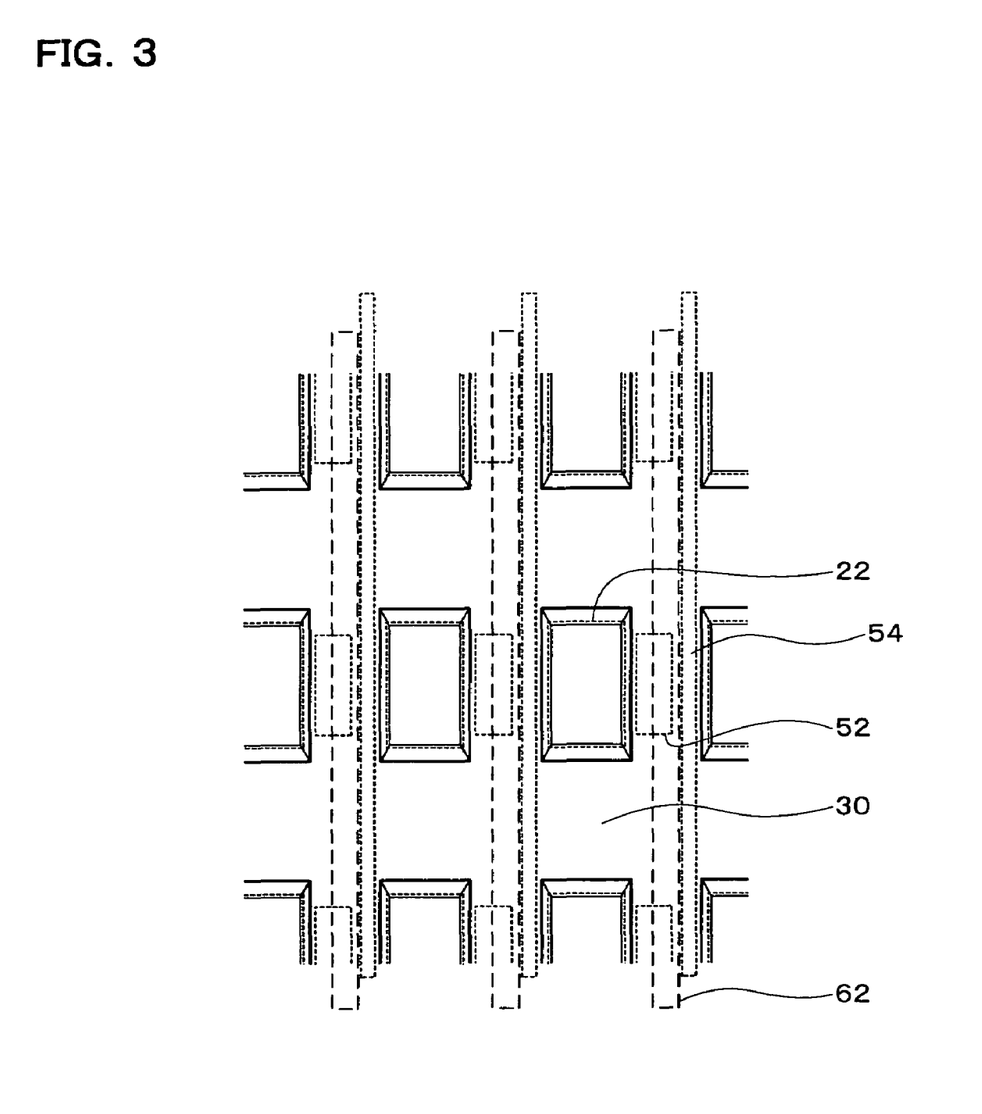
FIG. 3 is a plan view showing a bank according to one embodiment of the present invention.

Adjacent parts of the functional layer 22 are segmented (electrically insulated) by the bank 30. FIG. 3 is a plan view of the bank. The bank 30 is disposed to segment the functional layer 22 into a plurality of parts. The bank 30 may be arranged in the form of a lattice. The bank 30 is formed so that the region in which each segment of the functional layer 22 is formed is depressed. The bank 30 may be formed of resin.

The bank 30 includes a top surface 31, and a pair of side surfaces 33 and 35 on either side of the top surface 31. As shown in FIG. 2, the side surfaces 33 and 35 slope symmetrically with respect to the substrate 10 (or a surface thereof, for example). That is to say, with respect to the substrate 10 (or a surface thereof, for example), angles α and β formed by the side surfaces 33 and 35 with the top surface 31 (on the interior of the bank 30) are equal.

The bank 30 may include a first bank portion 36. The first bank portion 36 may be formed of an inorganic material (such as $SiO_2$ or $SiN_x$). The first bank portion 36 may be formed from multiple layers (which are a part of a layer continuously covering all second interconnecting lines 62, and a layer provided above each of the second interconnecting lines 52, for example). The bank 30 may also include a second bank portion 38 formed above the first bank portion 36. The second bank portion 38 may be formed of an organic material (or an organic resin such as acrylic or the like, for example).

The electro-optical device 1 has a plurality of first electrodes 32. Each of the first electrodes 32 supplies electrical energy to one of the operating elements 20. The first electrodes 32 may contact the operating elements 20 (the first buffer layer 24 or a positive hole injection layer, for example).

The electro-optical device 1 has one or more second electrode 34. The second electrodes 34 supply electrical energy to the operating element 20. The second electrodes 34 may contact the operating element 20 (the second buffer layer 26 or an electron injection layer, for example). The second electrode 34 partially faces the first electrode 32. One of the first electrodes 32 and the second electrodes 34 or one of the second electrodes 34 form a pair of electrodes with at least one of the functional layers 22 interposed. The second electrodes 34 may be disposed above the first electrode 32.

Figure 4:
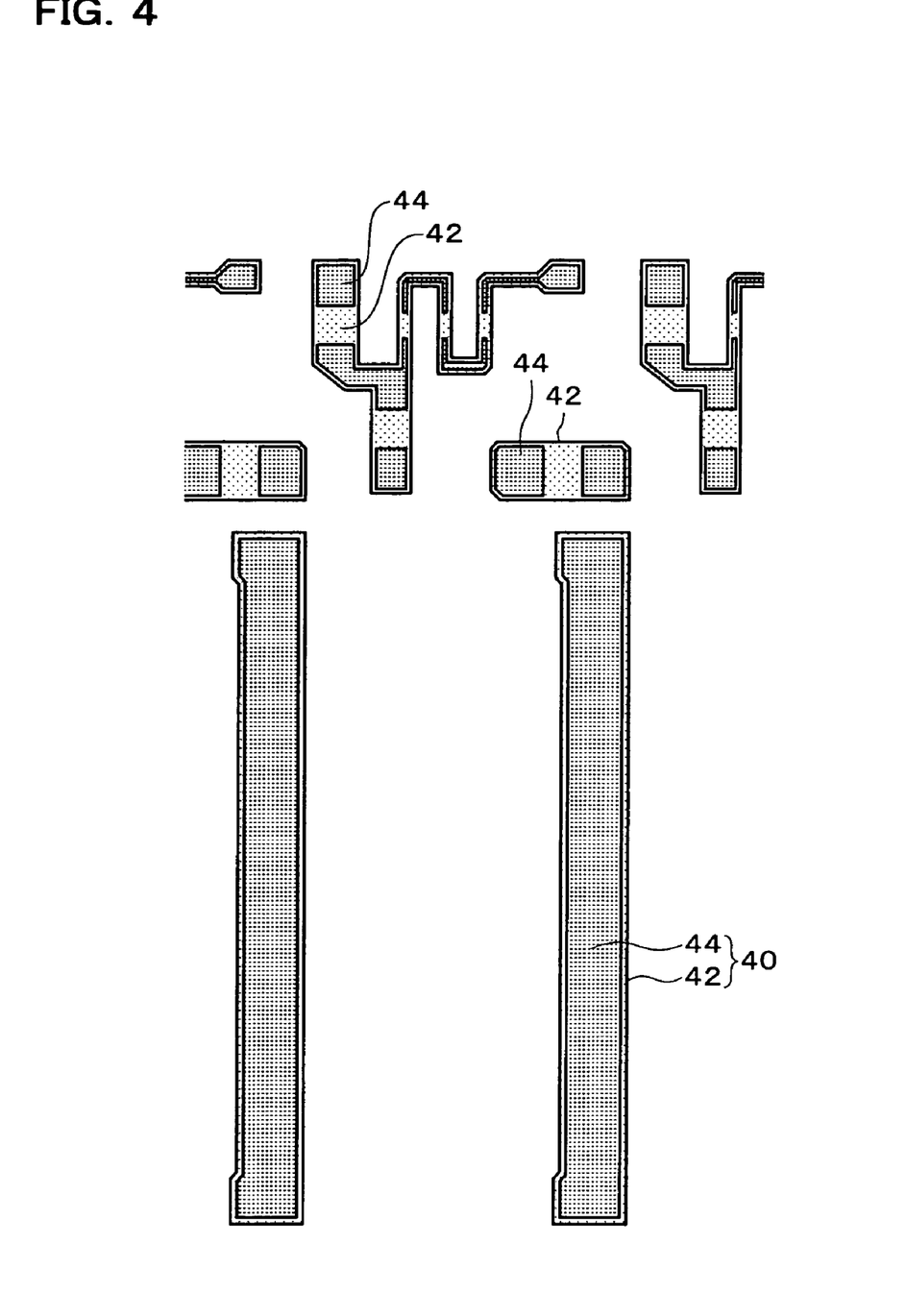
FIG. 4 shows a semiconductor film according to one embodiment of the present invention.

On the substrate 10, a semiconductor film 40 may be formed. FIG. 4 is a plan view showing the semiconductor film. The semiconductor film 40 may be formed of a semiconductor material (for example silicon). The semiconductor film 40 may be any of monocrystalline, polycrystalline, or amorphous. The semiconductor film 40 may be formed by a well-known low temperature (for example 600° C. or below) process, being a so-called low temperature polycrystalline silicon film or amorphous silicon film. The semiconductor film 40 has a base film 42. The base film 42 may be doped with n-type or p-type impurities. The semiconductor film 40 has an impurity-doped film 44. The impurity-doped film 24 may include a higher concentration of impurities than the base film 42. The impurity-doped film 44 is formed within a region of the base film 42. The impurity-doped film 44 may be formed by injecting impurities into a precursor film including a portion to form the base film 42 and a portion to form the impurity-doped film 44. At least a part of the impurity-doped film 44 may be a MOS FET source or drain, or may form an electrode of an electronic component such as the capacitor 88 (see FIG. 7) or the like.

Figure 5:
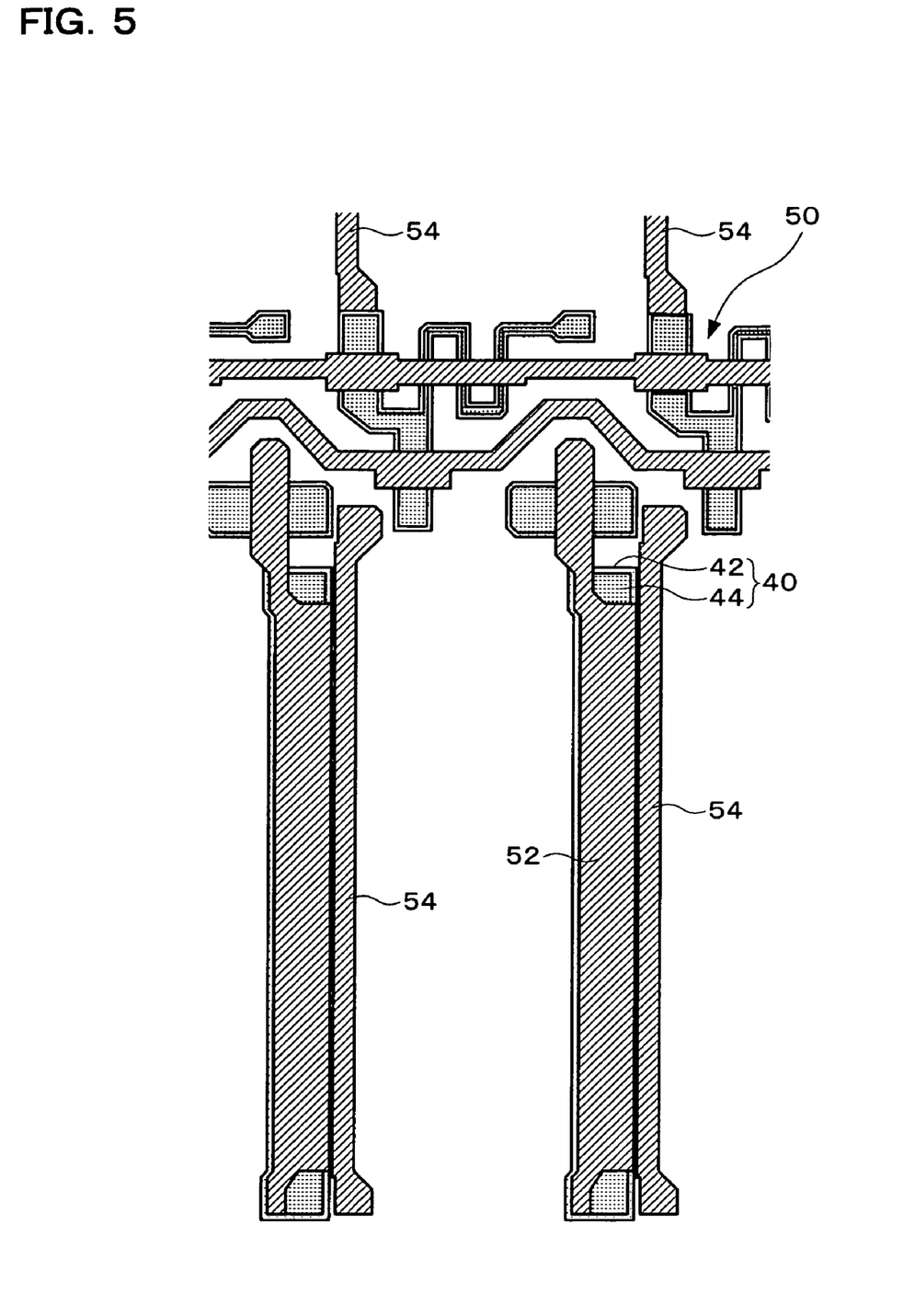
FIG. 5 illustrates an interconnecting pattern located in one of layers forming an interconnecting line layer.

The electro-optical device 1 has a interconnecting line layer formed of a plurality of layers. FIG. 5 illustrates an interconnecting pattern disposed in one of the layer in the interconnecting line layer. An interconnecting pattern 50 may be formed on the semiconductor film 40 with an insulating layer (an oxide film such as $SiO_2$, for example) 46 (see FIG. 2) interposed. The interconnecting pattern 50 includes a conductive layer 52. The conductive layer 52 may be formed to oppose the semiconductor film 40 (for example, the impurity-doped film 44 thereof), with an insulating layer 46 interposed. The conductive layer 52 may be a interconnecting line electrically connecting a plurality of locations, or may be an electrode (or terminal), with a part being a interconnecting line, and another part forming an electrode. The conductive layer 52 may be one electrode of the capacitor 88 (see FIG. 7). The conductive layer 52, as shown in FIGS. 2 and 3, is formed under the bank 30. The conductive layer 52 is formed between a pair of functional layers 22. In a display device, the conductive layer 52 is formed between pixels.

The interconnecting pattern 50 includes a first interconnecting line 54. The first interconnecting line 54 may extend alongside the conductive layer 52. The first interconnecting line 54, as shown in FIGS. 2 and 3, is formed under the bank 30. The first interconnecting line 54 is formed to pass between the pair of functional layers 22. In a display device, the first interconnecting line 54 passes between pixels. The first interconnecting line 54 may be electrically connected to the adjacent first interconnecting line 54 in the longitudinal direction, for example, constituting a signal line for driving the functional layer 22. While in FIG. 7 the first interconnecting line 54 is indicated as a signal line, the first interconnecting line 54 may equally be a scan line for driving the functional layer 22 or a power supply line.

Figure 6:
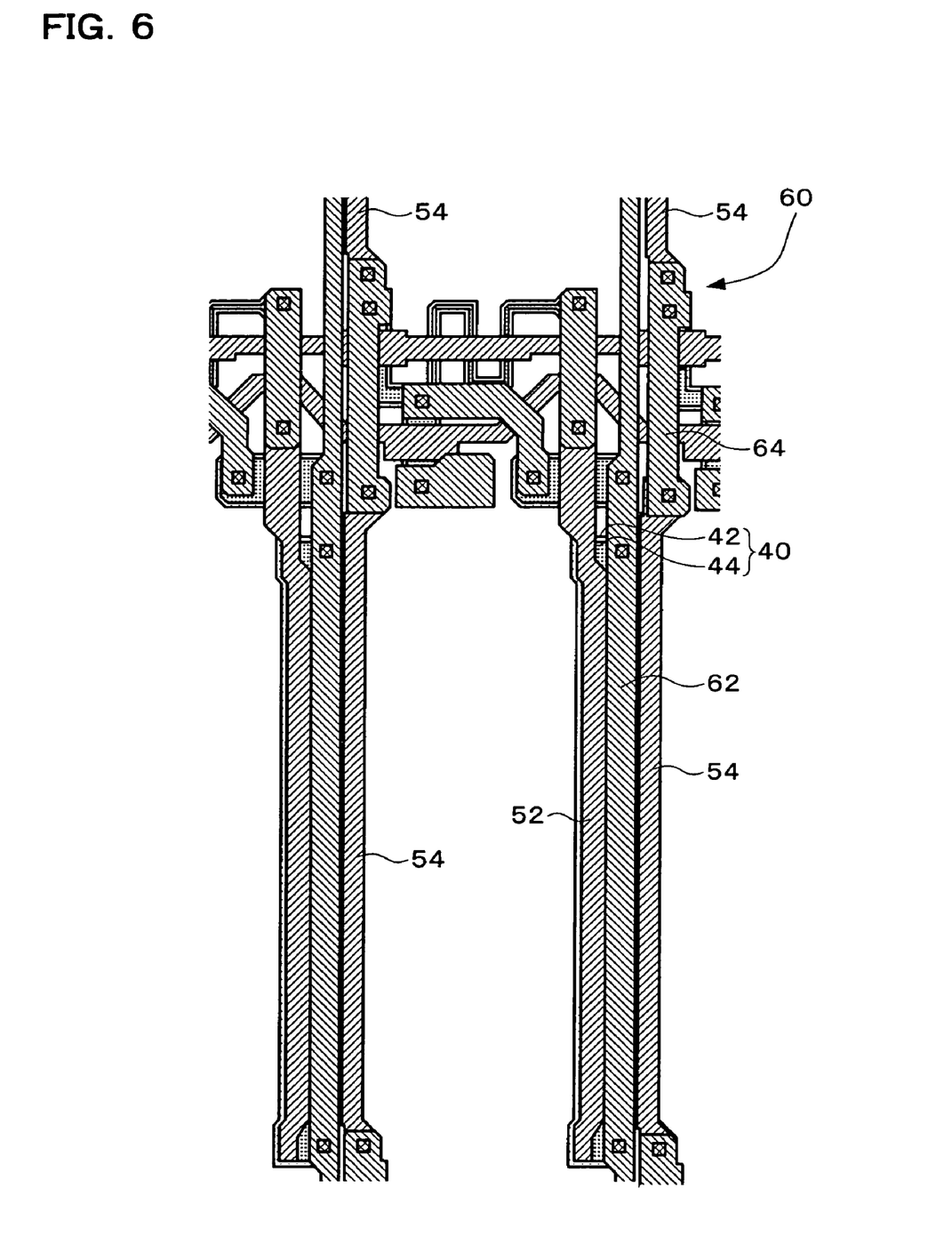
FIG. 6 illustrates an interconnecting pattern located in another one of the layers forming the interconnecting line layer.

FIG. 6 illustrates an interconnecting pattern located in another one of the layers in the interconnecting line layer. On the above described interconnecting pattern 50, a interconnecting pattern 60 may be formed with an insulating layer 56 (see FIG. 2) interposed. The interconnecting pattern 60 includes a second interconnecting line 62. The second interconnecting line 62, as shown in FIGS. 2 and 3, is formed under the bank 30. The second interconnecting line 62 may be disposed right under the bank 30 and within a range corresponding to the distance between the side surfaces 33 and 35 of the bank 30. In this case, the length of a portion of the bank 30 extending toward the side surface 33 and not located above the second interconnecting line 62, and the length of another portion of the bank 30 extending toward the side surface 35 and not located above the second interconnecting line 62 are equal. Alternatively, the second interconnecting line 62 may be disposed right under the first bank portion 36 or the second bank portion 38 and within a range corresponding to the distance between the side surfaces 33 and 35 of the bank 30. In this case, the length of a portion of the first bank portion 36 (or the second bank portion 38) extending toward the side surface 33 and not located above the second interconnecting line 62, and the length of another portion of the first bank portion 36 (or the second bank portion 38) extending toward the side surface 35 and not located above the second interconnecting line 62 are equal.

The second interconnecting line 62 is formed to pass between a pair of the functional layers 22. In a display device, the second interconnecting line 62 passes between pixels. The second interconnecting line 62 may be a power supply line for driving the functional layer 22. While in FIG. 7 the second interconnecting line 62 is indicated as a power supply line, the second interconnecting line 62 may equally be a scan line or signal line for driving the functional layer 22. The interconnecting pattern 60 may have a interconnecting line 64 connecting adjacent first interconnecting lines 54 in the length direction thereof.

As shown in FIG. 2, the conductive layer 52 and the first and second interconnecting lines 54 and 62 are formed to be parallel to each other under the bank 30. The first interconnecting line 54 constitutes a part of a drive circuit of one of adjacent functional layers 22 (a first functional layer, for example), and the conductive layer 52 constitutes a part of a drive circuit of the other of the adjacent functional layers 22 (a second functional layer, for example). Note that the conductive layer 52 and first and second interconnecting lines 54 and 62 are located between these adjacent functional layers, the same terminology used hereinafter. In this case, the second interconnecting line 62 constitutes a part of the drive circuit of the other of the adjacent functional layers 22 (the second functional layer, for example). That is, the conductive layer 52 and second interconnecting line 62 constitute part of the drive circuit of the same one of the adjacent functional layers 22.

The conductive layer 52 is formed in a position lower than the second interconnecting line 62 (or closer to the substrate 10). The first interconnecting line 54 is formed in a position lower than the second interconnecting line 62 (or closer to the substrate 10). As shown in FIGS. 2 and 3, the vertical centerline of the first interconnecting line 54 is not coincide with the vertical centerline of the second interconnecting line 62. The vertical centerline of the conductive layer 52 is not coincide with the vertical centerline of the second interconnecting line 62. The conductive layer 52 and first interconnecting line 54 respectively have portions extending in opposite width directions and not located under the second interconnecting line 62. The length $L_1$ of the portion of the conductive layer 52 not located under the second interconnecting line 62 and the length $L_2$ of the portion of the first interconnecting line 54 not located under the second interconnecting line 62 may be equal.

For example, if the first and second interconnecting lines 54 and 62 are disposed aligned to the right in FIG. 2, then the difference between the height of the right edge of the second interconnecting line 62, and the height of the insulating layer 56 positioned adjacent to the right is large, and a relatively large vertical relief of the insulating film over the second interconnecting line 62 and insulating layer 56 may ensue. According to this embodiment, the vertical centerline of the first interconnecting line 54 is not coincide with the vertical centerline of the second interconnecting line 62, and the vertical centerline of the conductive layer 52 is not coincide with the vertical centerline of the second interconnecting line 62, whereby the vertical relief of the insulating film over the first and second interconnecting lines 54 and 62 and the conductive layer 52 can be reduced, and as a result, the lateral asymmetry of the bank 30 can be reduced.

According to this embodiment, the conductive layer 52 and first interconnecting line 54 have portions extending opposite directions and not located under the second interconnecting line 62, so the lateral asymmetry of the bank 30 thereon can be reduced. As a result, nonuniformity of the film thickness of the functional layer 22 can be reduced.

Since the second interconnecting line 62 is formed over the conductive layer 52, the second interconnecting line 62 can be distanced from the first interconnecting line 54. Then the capacitance formed between the first and second interconnecting lines 54 and 62 can be reduced or made non-existent.

As shown in FIGS. 1 and 2, the electro-optical device 1 has a sealing member 66 for the operating element 20. If at least a part of the operating element 20 is susceptible to deterioration from moisture or oxygen or the like, the operating element 20 can be protected by the sealing member 66.

Figure 7:
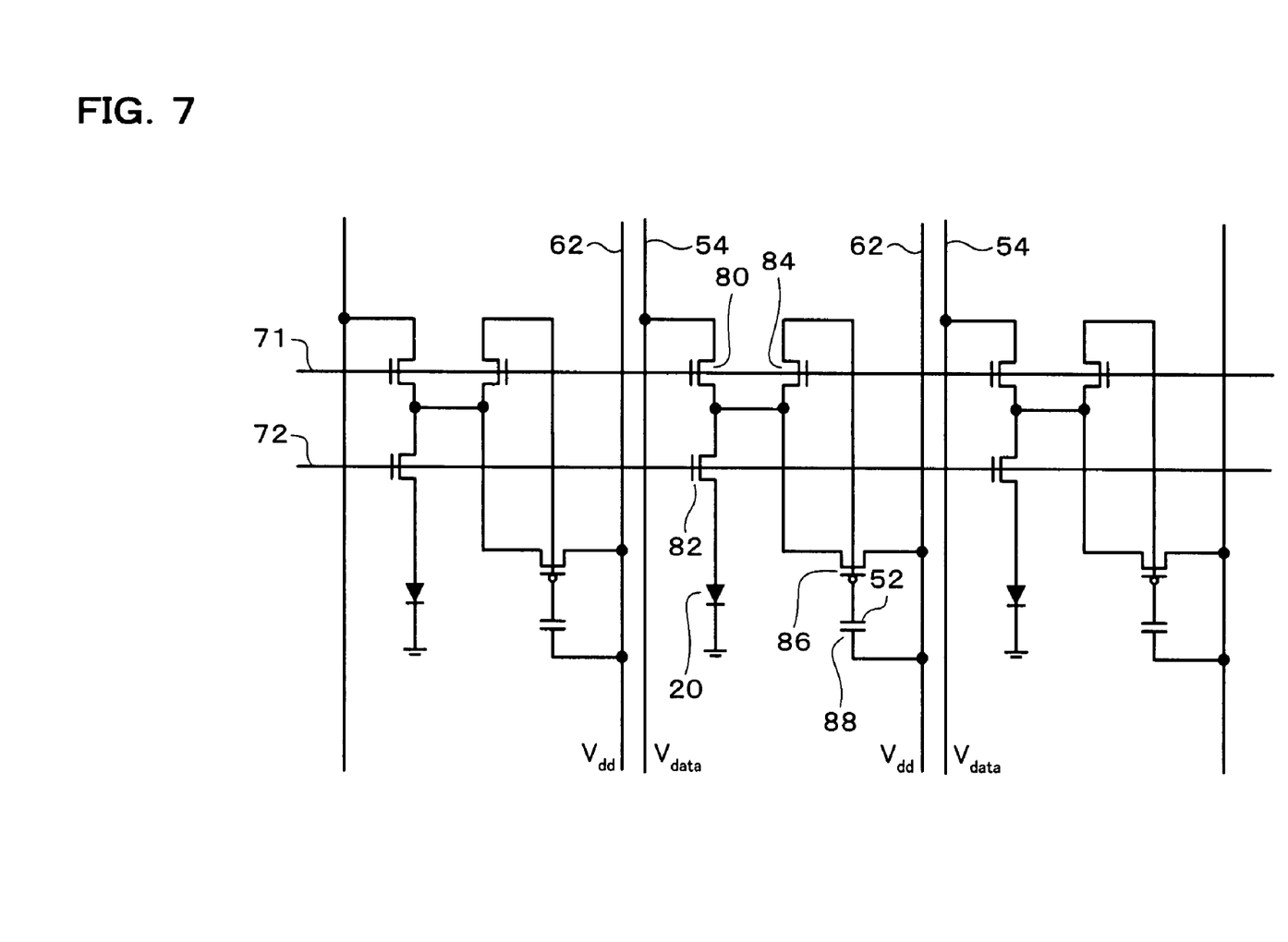
FIG. 7 is a circuit diagram for illustrating the operation of an electro-optical device according to one embodiment of the present invention.

FIG. 7 is a circuit diagram for illustrating the operation of the electro-optical device in this embodiment. The electro-optical device 1 has elements corresponding to the circuit shown in FIG. 7. The elements are provided for each operating element 20. The circuit construction (connection pattern of elements) is as shown in FIG. 7, and description thereof is omitted. In this embodiment, a signal voltage $V_{data}$ is supplied to the first interconnecting line 54. The signal voltage $V_{data}$ is a signal corresponding to the current supplied to the operating element 20. A power supply voltage $V_{dd}$ is supplied to the second interconnecting line 62. The interconnecting lines (scan lines) 71 and 72 have mutually opposite selection signals input. The selection signals are high level ("H") signal or low level "L" signals.

In a programming interval, a high level signal is input to the interconnecting line 71, and a low level signal is input to the interconnecting line 72. Then a switching element 80 turns on, and according to the potential difference between the first and second interconnecting lines 54 and 62, an electric current flows through the switching elements 80 and 86. The control voltage of the switching element 86 (gate voltage if the switching element 86 is a MOS transistor) depending on this electric current charges the capacitor 88. It should be noted that the capacitor 88, as shown in FIG. 5, includes the insulating layer 46 between the conductive layer 52 and the impurity-doped film 44.

In an operating interval (for example a light emitting interval), a low level signal is input to the interconnecting line 71, and a high level signal is input to the interconnecting line 72. Then the switching elements 80 and 84 turn off, and the switching element 82 turns on. As a result, the switching element 86 is controlled (for example turned on) by the control voltage (gate voltage if the switching element 86 is a MOS transistor) depending on the charge stored in the capacitor 88 during the programming interval, and a current depending on the control voltage flows from the second interconnecting line 62 through switching element 86 and 82, to the operating element 20 (or functional layer 22).

Figure 8:
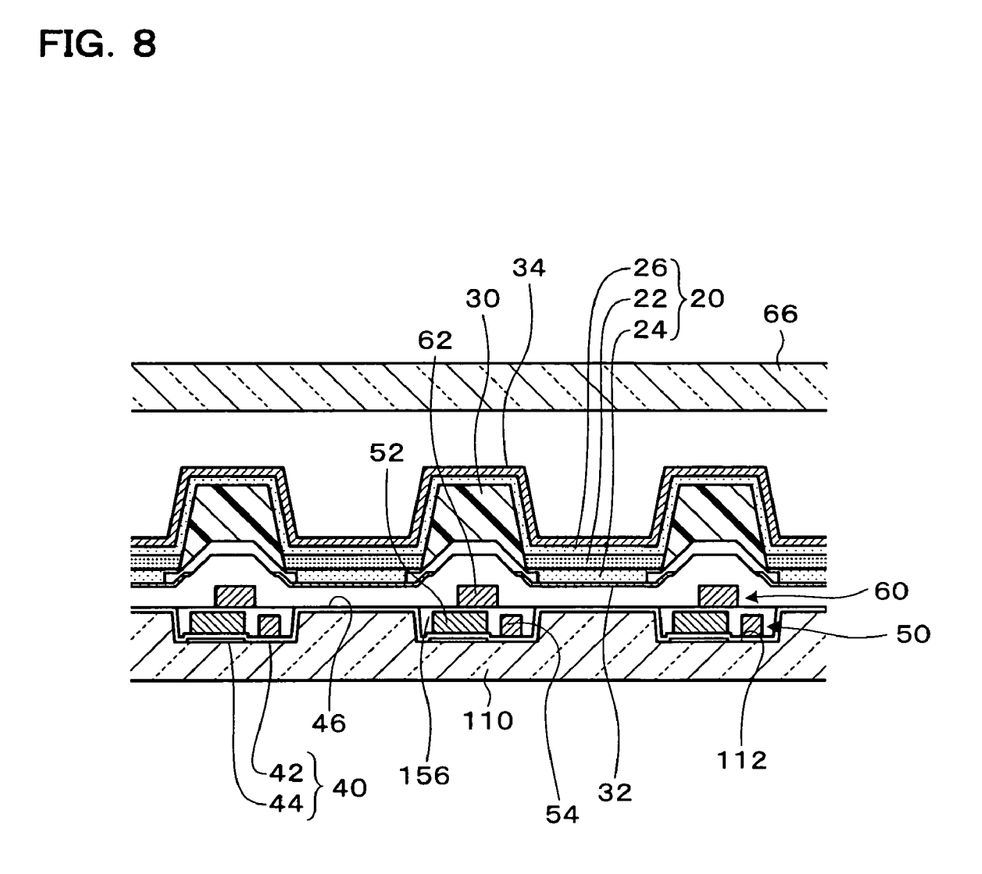
FIG. 8 illustrates a modification of the electro-optical device according to one embodiment of the present invention.

FIG. 8 illustrates a modification of the electro-optical device according to this embodiment. In this variant, a depression (or hollowing-out) 112 is formed in the substrate 10. The depression 112 can be formed by etching. Within the depression 112, the conductive layer 52 and first interconnecting line 54 are formed. The conductive layer 52 and first interconnecting line 54 may be formed with a height so as not to project beyond the surface of a substrate 110 (for example being thinner than the depth of the depression 112). The semiconductor film 40 also is formed within the depression 112. The insulating layer 46 is formed also on the inner surface of the depression 112.

The conductive layer 52 and first interconnecting line 54 may be covered by an insulating layer 156. The insulating layer 156 is formed in the depression 112, so as to fill the space around the conductive layer 52 and first interconnect ing line 54. The insulating layer 156 may cover the conductive layer 52 and first interconnecting line 54. In this case, the top surface of the insulating layer 156 may be flush with the surface of the substrate 110 or the insulating layer 46 over it. By this means, regardless of the form of the conductive layer 52 and first interconnecting line 54 (a form having lateral asymmetry with respect to the bank 30), the bank 30 can be formed with lateral symmetry.

In other respects, the description of the above described embodiment applies. According to the modification of FIG. 8, since the conductive layer 52 and first interconnecting line 54 are formed within the depression 112, the device can be made thinner. As another variant, if the top surface of the insulating layer 156 is flush with the surface of the substrate 110 or the insulating layer 46 over it, then the operating element 20 can overlap at least a part of the conductive layer 52 and first interconnecting line 54. Since the area occupied by the operating element 20 can be made larger than in the case of FIG. 2, an electro-optical device of high intensity can be realized.

Figure 9:
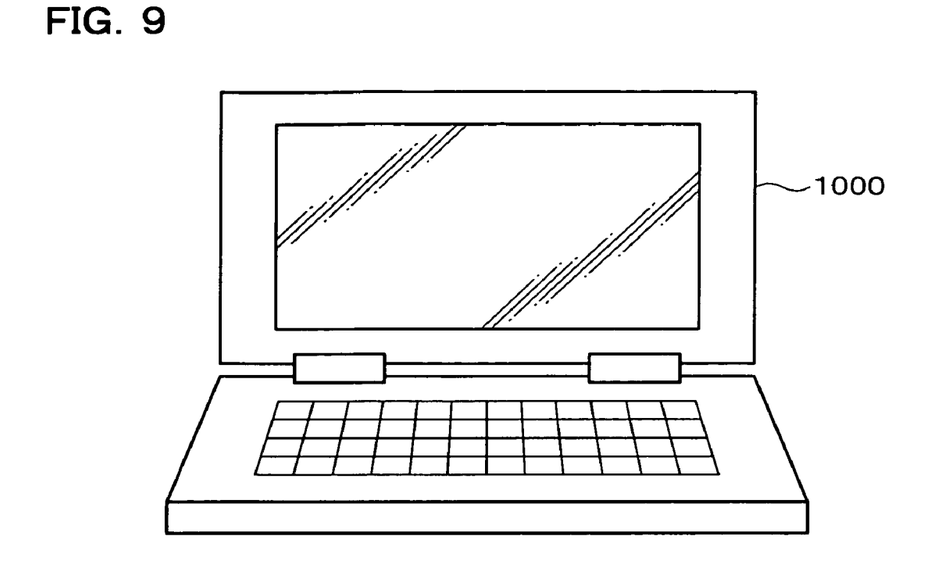
FIG. 9 shows an electronic instrument according to one embodiment of the present invention.
Figure 10:
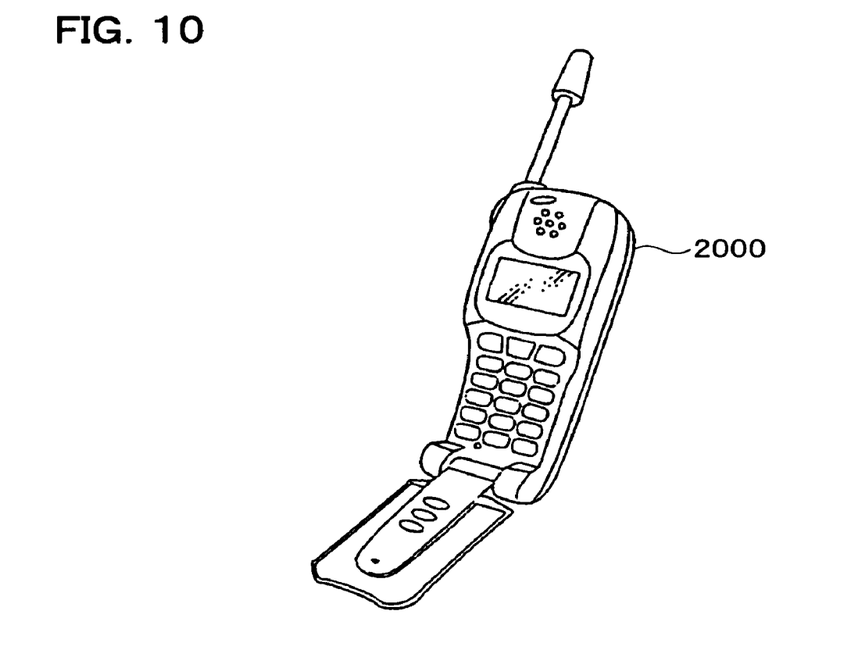
FIG. 10 shows another electronic instrument according to one embodiment of the present invention.

As an electronic instrument having the electro-optical device of the embodiment of the present invention, FIG. 9 shows a notebook personal computer 1000, and FIG. 10 shows a mobile telephone 2000.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A wiring board comprising:
   a substrate;
   a bank which is disposed above the substrate to provide a plurality of regions; and
   a conductive layer and first and second interconnecting lines formed between the substrate and the bank,
   the bank having a top surface and a pair of side surfaces provided on both sides of the top surface,
   the side surfaces sloping symmetrically with respect to the substrate,
   the first interconnecting line being formed in a position closer to the substrate than the second interconnecting line, and the vertical centerline of the first interconnecting line not coinciding with the vertical centerline of the second interconnecting line;
   the conductive layer being formed in a position closer to the substrate than the second interconnecting line, and the vertical centerline of the conductive layer not coinciding with the vertical centerline of the second interconnecting line; and
   the conductive layer and the first interconnecting line respectively having portions which are not located under the second interconnecting line, and the portions extending in opposite width directions.

2. The wiring board as defined in claim 1
   the lengths of the portions of the conductive layer and the first interconnecting line not located under the second interconnecting line being equal.

3. The wiring board as defined in claim 1
   the second interconnecting line being disposed right under the bank and within a range corresponding to the distance between the side surfaces of the bank.

4. The wiring board as defined in claim 3
   the bank including a first bank portion formed of an inorganic material, and a second bank portion formed of an organic material on the first bank portion; and
   the second interconnecting line being disposed right under the first and second bank portions within a range corresponding to the distance between the side surfaces of the bank.

5. The wiring board as defined in claim 3
   a depression being formed in the substrate; and
   the conductive layer and the first interconnecting line being disposed within the depression so as not to project above the surface of the substrate.

6. The wiring board as defined in claim 5
   the first interconnecting line constituting a part of a first drive circuit; and
   the conductive layer and the second interconnecting line constituting a part of a second drive circuit.

7. An electro-optical device comprising:
   the wiring board as defined in claim 6 and
   a functional layer disposed in each of the regions provided by the bank.

8. An electronic instrument comprising the electro-optical device as defined in claim 7.

9. A method of manufacturing an electro-optical device comprising:
   forming the wiring board as defined in claim 6; and
   forming a functional layer by disposing a liquid material including a functional layer material in each of the regions provided by the bank.

10. An electro-optical device comprising:
    the wiring board as defined in claim 5; and
    a functional layer disposed in each of the regions provided by the bank.

11. An electronic instrument comprising the electro-optical device as defined in claim 10.

12. A method of manufacturing an electro-optical device comprising:
    forming the wiring board as defined in claim 5; and
    forming a functional layer by disposing a liquid material including a functional layer material in each of the regions provided by the bank.

13. The wiring board as defined in claim 1
    the conductive layer being one of electrodes of a capacitor.

14. The wiring board as defined in claim 1
    the first and second interconnecting lines being respectively a signal line and a power supply line.

15. An electro-optical device comprising:
    the wiring board as defined in claim 1; and
    a functional layer disposed in each of the regions provided by the bank.

16. An electronic instrument comprising the electro-optical device as defined in claim 15.

17. A method of manufacturing an electro-optical device comprising:
    forming the wiring board as defined in claim 1; and
    forming a functional layer by disposing a liquid material including a functional layer material in each of the regions provided by the bank.

18. A wiring board comprising:
a substrate;
a bank which is disposed above the substrate to provide a plurality of regions; and
a conductive layer and first and second interconnecting lines formed between the substrate and the bank,
the bank having a top surface and a pair of side surfaces provided on both sides of the top surface, the side surfaces sloping symmetrically with respect to the substrate,
the first interconnecting line constituting a part of a first drive circuit, and
the conductive layer and the second interconnecting line constituting a part of a second drive circuit.

* * * * *